(12) United States Patent
Kim et al.

(10) Patent No.: US 9,472,494 B2
(45) Date of Patent: Oct. 18, 2016

(54) LEAD FRAME FOR SEMICONDUCTOR DEVICE

(75) Inventors: Joon Su Kim, Kyunggi-do (KR); Jung Soo Park, Seoul (KR); Gi Jeong Kim, Kyunggi-do (KR)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 13/466,717

(22) Filed: May 8, 2012

(65) Prior Publication Data

US 2012/0299172 A1 Nov. 29, 2012

(30) Foreign Application Priority Data

May 27, 2011 (KR) .................. 10-2011-0050527

(51) Int. Cl.
*H01L 23/48* (2006.01)
*H01L 23/495* (2006.01)

(52) U.S. Cl.
CPC . *H01L 23/49582* (2013.01); *H01L 2924/0002* (2013.01)

(58) Field of Classification Search
CPC ...................................... H01L 23/02
USPC ...................................... 257/666
See application file for complete search history.

(56) References Cited

U.S. PATENT DOCUMENTS

| | | | |
|---|---|---|---|
| 5,710,456 A * | 1/1998 | Abbott .................. | C23C 28/023 257/666 |
| 5,767,574 A * | 6/1998 | Kim et al. ..................... | 257/677 |
| 2003/0155638 A1 * | 8/2003 | Ito .................................. | 257/678 |
| 2006/0102936 A1 * | 5/2006 | Tomohiro et al. ............ | 257/257 |
| 2010/0181659 A1 * | 7/2010 | Hanson et al. ............... | 257/676 |
| 2012/0107639 A1 * | 5/2012 | Takamizawa et al. ....... | 428/620 |

FOREIGN PATENT DOCUMENTS

| | | |
|---|---|---|
| JP | 11274177 | 10/1999 |
| JP | 2007258490 | 10/2007 |
| KR | 1019960080060 B1 | 12/1996 |
| KR | 1019980060697 | 10/1998 |
| KR | 1020100072905 A | 7/2010 |
| KR | 1020110050527 | 5/2011 |

OTHER PUBLICATIONS

Korean Office Action dated May 31, 2012 corresponding to Korean Patent Application No. 10-2011-0050527, pp. 1-5.

* cited by examiner

*Primary Examiner* — William Harriston
(74) *Attorney, Agent, or Firm* — McAndrews, Held & Malloy, Ltd.

(57) ABSTRACT

Provided is a lead frame for a semiconductor device, which includes a base layer made of copper, a strike plating layer or a self assembly monolayer (SAM), thereby preventing oxidation of a base layer while simplifying the manufacturing process, reducing the manufacturing costs and reducing a failure ratio. In one embodiment, in the lead frame for a semiconductor device including a die pad and a plurality of leads positioned adjacent to each other around the die pad, the lead frame includes a base layer made of copper; and a first strike plating layer formed on the one or more portions of the surface of the base layer.

15 Claims, 6 Drawing Sheets

LEAD FRAME FOR SEMICONDUCTOR DEVICE

CROSS-REFERENCE TO RELATED APPLICATIONS/INCORPORATION BY REFERENCE

The present application makes reference to, claims priority to, and claims the benefit of Korean Patent Application No. 10-2011-0050527, filed on May 27, 2011, the contents of which is hereby incorporated herein by reference, in its entirety.

FIELD OF THE INVENTION

The present invention relates to a lead frame for a semiconductor device.

BACKGROUND OF THE INVENTION

A lead frame for a semiconductor device is an essential component of the semiconductor device with a semiconductor die. The lead frame for a semiconductor device is manufactured by chemically etching or mechanically stamping a metal strip. The lead frame may serve as an electric lead to connect a semiconductor die to an external substrate and as a frame for fixing the semiconductor device to the external substrate.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A device and method is provided for a lead frame for a semiconductor device, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Aspects of the present invention relate to lead frames used in assembly and packaging of integrated circuits. More specifically, representative embodiments of the present invention may relate to the preparation of leads frames using strike plating and a self assembly monolayer material to more effectively prevent oxidation of a base layer of the lead frame, while simplifying the manufacturing process, thus reducing manufacturing cost and reducing failure rate.

Figure 1:
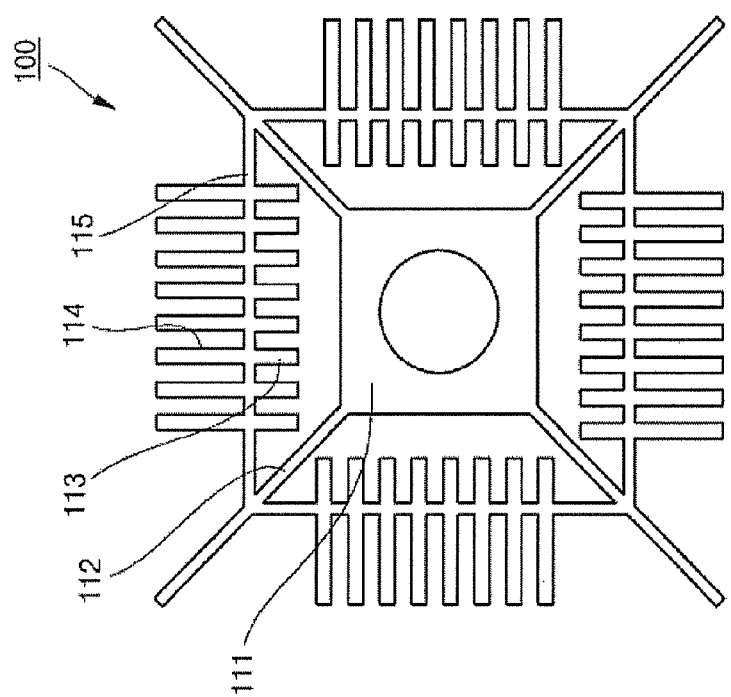
FIG. 1 is a plan view of an exemplary lead frame for a semiconductor device, in accordance with a representative embodiment of the present invention.

FIG. 1 is a plan view of an exemplary lead frame 100 for a semiconductor device, in accordance with a representative embodiment of the present invention. As illustrated in FIG. 1, the lead frame may be formed of a metal strip using, for example, a mechanical stamping or a chemical etching method. The lead frame 100 serves as an electric lead or path to connect the circuitry of a semiconductor die mounted to one surface of the lead frame to an external circuit. In addition, the lead frame 100 may serve as a frame for physically fixing or mounting a semiconductor device to an external device, where the semiconductor device may include the lead frame 100, a semiconductor die, one or more conductive wires that electrically connect the lead frame 100 to the circuitry of the semiconductor die, and an encapsulant that encapsulates the lead frame 100 with the semiconductor die and the one or more conductive wires.

As illustrated in the example of FIG. 1, the lead frame 100 includes a die pad 111 having multiple sides and edges, and a plurality of leads 112, 113, and 114 positioned adjacent to each other around the die pad 111. The die pad 111 of FIG. 1 has a substantially rectangular plate shape and has four sides and four edges. The die pad 111 provides for an area or space to which the semiconductor die may be attached. The plurality of leads 112, 113, and 114 may be divided into a plurality of tie bars 112, a plurality of inner leads 113, and a plurality of outer leads 114.

As shown in the example of FIG. 1, in one representative embodiment of the present invention, the tie bars 112 extend outwardly from the respective edges of the die pad 111. That is to say, the tie bars 112 extend from the edges of the die pad 111 outwardly and in imaginary diagonal directions. The tie bars 112 may function to maintain flattening of the lead frame 100.

The lead frame 100 comprises a plurality of leads, each having an inner lead 113 and a corresponding outer lead 114. The plurality of inner leads 113 are spaced apart from the die pad 111 and extend outwardly. The plurality of inner leads 113 are arranged to be perpendicular to the sides of the die pad 111. The plurality of inner leads 113 are exposed to a portion of the semiconductor die.

The plurality of outer leads 114 are arranged to outwardly extend from and be electrically connected to a corresponding one of the plurality of inner leads 113. The plurality of outer leads 114 are exposed to a side or bottom portion of semiconductor device and are mounted onto the external device using soldering to then be electrically connected to the external device. As shown in the example of FIG. 1, a ring-shaped dam bar 115 may be formed that runs between the neighboring pairs of inner leads 113 and outer leads 114. The dam bar 115 may be removed from between neighboring pairs of corresponding inner leads 113 and outer leads 114 in the course of manufacturing the semiconductor device using, for example, a sawing process, thereby electrically isolating the inner lead 113 and outer lead 114 of each lead from a neighboring inner lead 113 and outer lead 114.

Figure 2:
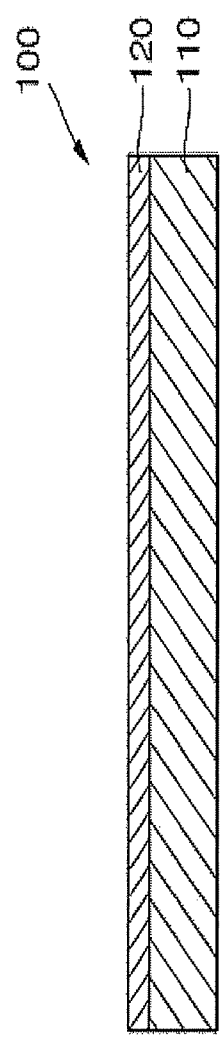
FIG. 2 is a cross-sectional view of an exemplary lead frame for a semiconductor device that may correspond to, for example, the lead frame shown in FIG. 1, in accordance with a representative embodiment of the present invention.

FIG. 2 is a cross-sectional view of an exemplary lead frame 100 for a semiconductor device that may correspond to, for example, the lead frame 100 shown in FIG. 1, in accordance with a representative embodiment of the present invention. As shown in the example of FIG. 2, the lead frame 100 includes a base layer 110 and a first strike plating layer 120. The base layer 110 forms a base of the lead frame 100 and may be flatly formed. In the representative embodiment shown in FIG. 2, the base layer 110 is made of copper (Cu) having high electrical conductivity.

As shown in the representative embodiment illustrated in FIG. 2, the first strike plating layer 120 is formed on the base layer 110. The first strike plating layer 120 prevents the base layer 110, which in the example of FIG. 2 is made of Cu, from being oxidized, thereby facilitating bonding in connecting a conductive wire to the lead frame 100. In the representative embodiment shown in FIG. 2, the first strike plating layer 120 may be formed, for example, by plating at least one selected from gold, silver, and palladium onto one or more selected portions (e.g., a top surface), or the entire surface of the base layer 110 using a strike plating method. That is, in one representative embodiment of the present invention, a gold strike plating layer may be formed onto one or more portions, or the entire surface of the base layer 110, in another representative embodiment of the present invention, a silver strike plating layer may be formed onto one or more portions, or the entire surface of the base layer 110, and in yet another representative embodiment, a palladium strike plating layer may be formed onto one or more portions, or the entire surface of the base layer 110. Details of the general concept of strike plating are known in the art, and are not described here.

A representative embodiment of the present invention simplifies the process and reduces the cost of production of lead frames by forming a strike plating layer such as, for example, the first strike plating layer 120, at a thickness in a range of approximately 20 nm to approximately 100 nm. By using a strike plating layer thickness in the range of approximately 20 nm to approximately 100 nm in accordance with a representative embodiment of the present invention, incomplete coverage of the base layer (e.g., base layer 110) resulting from strike plating thickness less that 20 nm and increased manufacturing cost resulting from a strike plating thickness greater than 100 nm, may be avoided. In comparison to a conventional process in which a plating of, for example, silver, nickel, and palladium, may be sequentially formed to a thickness in a range of approximately 100 nm to approximately 500 nm, where processing steps before and after the plating may be required, and where many types of chemicals may be required, the use of a representative embodiment of the present invention simplifies the plating process and reduces failure rate.

As described above, a lead frame in accordance with a representative embodiment of the present invention, such as the lead frame 100 of FIG. 1 and FIG. 2, includes a base layer 110 made of copper and a first strike plating layer 120 formed on the base layer 110 using a strike plating method, thereby preventing the base layer 110 from being oxidized while also simplifying the manufacturing process and reducing the manufacturing cost, while also reducing the rate of failure. In addition, bonding of conductive wires to the lead frame 100 is facilitated.

Figure 3:
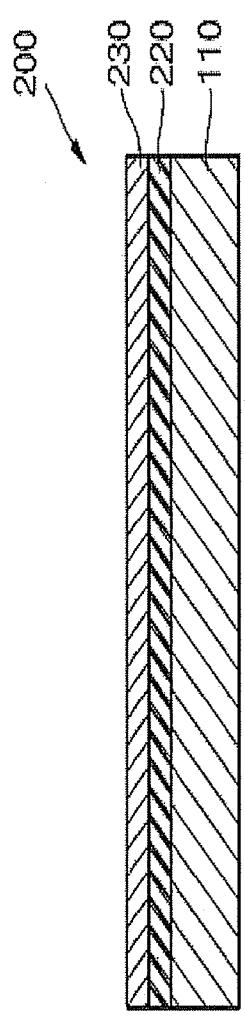
FIG. 3 is a cross-sectional view of an exemplary lead frame for a semiconductor device, in accordance with another representative embodiment of the present invention.

FIG. 3 is a cross-sectional view of an exemplary lead frame 200 for a semiconductor device, in accordance with another representative embodiment of the present invention. The lead frame 200 of FIG. 3 is substantially the same as the lead frame 100 shown in FIG. 2, except for cross-sectional structure. Accordingly, the following description will focus on differences between the lead frame 200 and the lead frame 100 shown in FIG. 2, in view of the cross-sectional structure of the lead frame 200.

As shown in the illustration of FIG. 3, a lead frame in accordance with a representative embodiment of the present invention, such as the lead frame 200, may include a base layer 110, a first strike plating layer 220, and a second strike plating layer 230. The first strike plating layer 220 is similar to the first strike plating layer 120 shown in FIG. 2. However, the first strike plating layer 220, which may include copper (Cu), may be formed, for example, by partially (e.g., a top surface) or entirely plating at least one selected from gold, silver, and palladium using a strike plating method. Because the first strike plating layer 220 of FIG. 3 is positioned between the base layer 110 and the second strike plating layer 230, the second strike plating layer 230 can prevent the first strike plating layer 220, even when formed of copper (Cu), from being oxidized.

In the representative embodiment of FIG. 3, the second strike plating layer 230 is formed, for example, by partially (e.g., a top surface) or entirely plating at least one selected from gold, silver, and palladium onto the first strike plating layer 220 using a strike plating method. That is, in some representative embodiments of the present invention, a gold strike plating layer may be formed, for example, on one or more portions, or the entire surface of the first strike plating layer 220. In other representative embodiments of the present invention, a silver strike plating layer may be formed, for example, on one or more portions, or the entire surface of the first strike plating layer 220. In yet other representative embodiments of the present invention, a palladium strike plating layer may be formed, for example, on one or more portions, or the entire surface of the first strike plating layer 220.

In the exemplary embodiment of FIG. 3, the second strike plating layer 230 may be made of a different material from the first strike plating layer 220. For example, if the first strike plating layer 220 is made of copper (Cu), the second strike plating layer 230 may be formed of at least one of gold, silver, and palladium. Because the first strike plating layer 220 and the second strike plating layer 230 may be formed of equivalent materials, bondability, electrical conductivity, and mechanical strength are high. In addition, the second strike plating layer 230 may be formed to a thickness in a range of approximately 20 nm to approximately 100 nm using a strike plating method, like the first strike plating layer 220. In a representative embodiment of the present invention, the second strike plating layer 230 may, for example, be partially or entirely over-coated on the first strike plating layer 220, thereby more effectively preventing the base layer 110 from being oxidized.

As described above, a lead frame in accordance with a representative embodiment of the present invention, such as the lead frame 200 of FIG. 3, may include a base layer 110 made of copper, and a first strike plating layer 220 formed on the base layer 110 using a strike plating method, thereby more effectively preventing the base layer 110 from being oxidized while simplifying the manufacturing process and reducing the manufacturing cost, while also reducing a failure rate. In addition, bonding of one or more conductive wires is facilitated.

Figure 4:
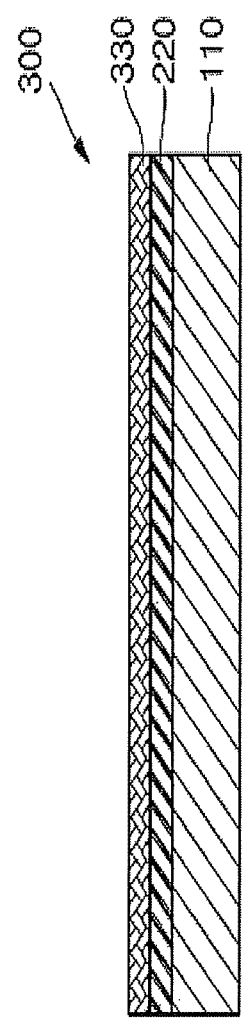
FIG. 4 is a cross-sectional view of an exemplary lead frame for a semiconductor device, in accordance with another representative embodiment of the present invention.

FIG. 4 is a cross-sectional view of an exemplary lead frame 300 for a semiconductor device, in accordance with another representative embodiment of the present invention. The lead frame 300 of FIG. 4 is substantially the same as the lead frame 200 shown in FIG. 3, except for cross-sectional structure. Accordingly, the following description will focus on differences between the lead frame 300 and the lead frame 200 shown in FIG. 3, in view of the cross-sectional structure of the lead frame 300.

As illustrated in the example of FIG. 4, a lead frame in accordance with a representative embodiment of the present invention, such as the lead frame 300, may include a base layer 110, a first strike plating layer 220, and a self assembly monolayer (SAM) 330. In a representative embodiment of the present invention, the first strike plating layer 220 may be formed onto the base layer 110 using a strike plating method, and the SAM 330 may be formed, for example, onto one or more portions (e.g., a top surface), or the entire surface of the first strike plating layer 220 using a spin coating method. The SAM 330 prevents external foreign matter or moisture from being induced into the first strike plating layer 220. The SAM 330 may be melted by heat in the course of forming a conductive wire to allow the conductive wire to be bonded to the first strike plating layer 220. In a representative embodiment of the present invention, the SAM 330 may be made of a material such as, for example, alkanethiol, having a high affinity for gold, silver, or palladium and forming the first strike plating layer 220.

As described above, the exemplary lead frame 300 of FIG. 4 includes a base layer 110, which may be made of copper, a first strike plating layer 220 formed onto the base layer 110 using a strike plating method, and a self assembly monolayer 330 formed onto the first strike plating layer 220 using a spin coating method. Such a representative embodiment of the present invention thereby more effectively prevents the base layer 110 from being oxidized while simplifying the manufacturing process and reducing the manufacturing cost, while also reducing a failure rate. In addition, bonding of the conductive wire is facilitated.

Figure 5:
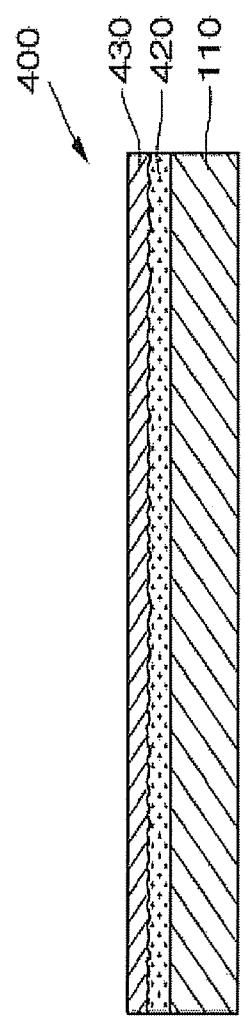
FIG. 5 is a cross-sectional view of an exemplary lead frame for a semiconductor device, in accordance with yet another representative embodiment of the present invention.

FIG. 5 is a cross-sectional view of an exemplary lead frame 400 for a semiconductor device, in accordance with yet another representative embodiment of the present invention. The lead frame 400 of FIG. 5 is substantially the same as the lead frame 100 shown in FIG. 2, except for cross-sectional structure. Accordingly, the following description will focus on differences between the lead frame 400, and the lead frame 100 shown in FIG. 2, in view of the cross-sectional structure of the lead frame 400.

As shown in FIG. 5, a lead frame in accordance with a representative embodiment of the present invention, such as the lead frame 400, may include a base layer 110, a rough copper layer 420, and a first strike plating layer 430. The rough copper layer 420 may have a roughened top surface and may be formed, for example, by plating copper onto one or more portions (e.g., a top surface), or the entire surface of the base layer 110 using a strike plating method. As illustrated in FIG. 5, the rough copper layer 420 is disposed between the base layer 110 and the first strike plating layer 430 and can prevent a copper material plated on the base layer 110 from being oxidized. In addition, the rough copper layer 420 has a roughened top surface to have a widened contact area with the first strike plating layer 430, thereby increasing bondability between the rough copper layer 420 and the first strike plating layer 430. Further, it is possible to prevent external foreign matter or moisture from being induced into the rough copper layer 420. In the illustrated embodiment of FIG. 5, a rough copper layer in accordance with a representative embodiment of the present invention, such as the rough copper layer 420, may be formed, for example, by plating, which is illustrated by way of example, and may also be formed by a micro-etching method.

The first strike plating layer 430 is similar to the first strike plating layer 120 shown in FIG. 2. However, the first strike plating layer 430 of the exemplary lead frame 400 of FIG. 5 is plated on the top surface of the rough copper layer 420 using a strike plating method.

As described above, the exemplary lead frame 400 of FIG. 5 includes a base layer 110 made of copper, a rough copper layer 420 plated on the top surface of the base layer 110, and a first strike plating layer 430 plated on the rough copper layer 420 using a strike plating method, thereby more effectively preventing the base layer 110 from being oxidized while simplifying the manufacturing process and reducing the manufacturing cost while reducing a failure rate and increasing bondability between the rough copper layer 420 and first strike plating layer 430. The rough copper layer 420 may be formed using a strike plating method.

Figure 6:
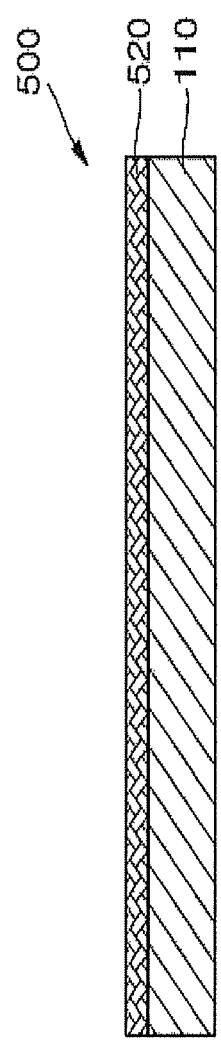
FIG. 6 is a cross-sectional view of an exemplary lead frame for a semiconductor device, in accordance with still another representative embodiment of the present invention.

FIG. 6 is a cross-sectional view of an exemplary lead frame 500 for a semiconductor device, in accordance with still another representative embodiment of the present invention. The lead frame 500 of FIG. 6 is substantially the same as the lead frame 300 of FIG. 4, except for cross-sectional structure. Accordingly, the following description will focus on differences between the lead frame 500 and the lead frame 300 shown in FIG. 4, in view of the cross-sectional structure of the lead frame 500.

As illustrated in the example of FIG. 6, a lead frame in accordance with a representative embodiment of the present invention, such as the lead frame 500, may include a base layer 110 and a self assembly monolayer (SAM) 520. The SAM 520 of FIG. 6 is similar to the SAM 330 shown in FIG. 4. However, the SAM 520 may, for example, be formed directly onto the base layer 110 using a spin coating method. The SAM 520 prevents external foreign matter or moisture from being induced into the base layer 110. In the representative embodiment of FIG. 5, the SAM 520 may be melted by heat in the course of forming a conductive wire to allow the conductive wire to be bonded to the base layer 110. The SAM 520 may be made of a material such as, for example, alkanethiol, having a high affinity for a material such as, for example, copper, forming the base layer 110. Because the SAM 520 may be directly formed on the base layer 110 without an intermediate layer, the manufacturing process of the exemplary lead frame 500 can be simplified and the manufacturing cost can be reduced, while also reducing the rate of failure.

As described above, the exemplary lead frame 500 of FIG. 6 may include a base layer 110 that may be made of copper, and the SAM 520 may be formed directly onto the base layer 110 using a spin coating method, thereby more effectively preventing the base layer 110 from being oxidized while simplifying the manufacturing process, reducing the manufacturing cost and reducing a failure rate.

One aspect of an embodiment of the present invention is to provide a lead frame for a semiconductor device, which includes a base layer made of copper, and a strike plating layer or a self assembly monolayer (SAM), thereby preventing oxidation of the base layer while simplifying the manufacturing process, reducing the manufacturing costs, and reducing a failure rate.

According to aspects of the present invention, there is provided a lead frame for a semiconductor device including a die pad and a plurality of leads positioned adjacent to each other around the die pad, the lead frame comprising a base layer made of copper; and a first strike plating layer formed on one or more portions, or the entire surface of the base layer. The first strike plating layer may be formed by plating at least one selected from gold, silver and palladium using a strike plating method. The lead frame may further include a second strike plating layer formed on one or more portions, or the entire surface of the first strike plating layer.

The first strike plating layer may be formed by plating at least one selected from gold, silver, and palladium using a strike plating method, and the second strike plating layer may be formed by plating at least one selected from gold, silver, and palladium using the strike plating method. The second strike plating layer may be made of a different material from the first strike plating layer. Each of the first strike plating layer and the second strike plating layer may have a thickness in a range of 20 nm to 100 nm.

The lead frame may further include a self assembly monolayer (SAM) coated on one or more portions, or the entire surface of the first strike plating layer. The first strike plating layer may be formed by plating at least one selected from gold, silver, and palladium using a strike plating method and the self assembly monolayer (SAM) may be formed by depositing alkanethiol using a spin coating method.

The lead frame may further include a rough copper layer disposed between the base layer and the first strike plating layer. The rough copper layer may have a roughened top surface. The first strike plating layer may be formed by plating at least one selected from gold, silver and palladium using a strike plating method.

According to other aspects of the present invention, there is provided a lead frame for a semiconductor device including a die pad and a plurality of leads positioned adjacent to each other around the die pad, the lead frame including a base layer made of copper; and a self assembly monolayer (SAM) coated on one or more portions, or the entire surface of the base layer. The self assembly monolayer (SAM) may be formed by depositing alkanethiol using a spin coating method.

Aspects of the present invention may also be seen in a lead frame for a semiconductor device, in which the lead frame comprises a die pad and a plurality of leads positioned adjacent to each other around the die pad. The lead frame may comprise a base layer made of copper and a first strike plating layer formed on one or more portions, or the entire surface of the base layer. The first strike plating layer may be formed by plating at least one selected from gold, silver, and palladium using a strike plating method, and the first strike plating layer may have a thickness in a range of 20 nm to 100 nm. The lead frame may further comprise a second strike plating layer formed on one or more portions, or the entire surface of the first strike plating layer, and the first strike plating layer and the second strike plating layer may each have a thickness in a range of 20 nm to 100 nm. The first strike plating layer may be formed by plating at least one selected from gold, silver, and palladium using a strike plating method, and the second strike plating layer may be formed by plating at least one selected from gold, silver, and palladium using the strike plating method. The second strike plating layer may be made of a different material from the first strike plating layer.

In some representative embodiments, the lead frame may comprise a self assembly monolayer (SAM) coated on one or more portions, or the entire surface of the first strike plating layer. The first strike plating layer may formed by plating at least one selected from gold, silver, and palladium using a strike plating method, and the self assembly monolayer (SAM) may be formed by depositing alkanethiol using a spin coating method. In some representative embodiments, the lead frame may further comprise a rough copper layer disposed between the base layer and the first strike plating layer, and the rough copper layer may have a roughened top surface. In such embodiments, the first strike plating layer may be formed by plating at least one selected from gold, silver, and palladium using a strike plating method.

Additional aspects of the present invention may be observed in a lead frame for a semiconductor device, in which the lead frame comprises a die pad and a plurality of leads positioned adjacent to each other around the die pad. The die pad and the plurality of leads may comprise a base layer made of copper, and a self assembly monolayer (SAM) may be coated on one or more portions, or the entire surface of the base layer. The self assembly monolayer (SAM) may be formed by depositing alkanethiol using a spin coating method.

Further aspects of the present invention may be found in a method of producing a lead frame for a semiconductor device. Such a method may comprise forming a lead frame comprising a die pad and a plurality of leads positioned adjacent to each other around the die pad from a base layer made of copper, and forming a first strike plating layer on one or more portions, or the entire surface of the base layer. Forming the first strike plating layer may comprise plating at least one selected from gold, silver, and palladium using a strike plating method. The method may also comprise forming a second strike plating layer on one or more portions, or the entire surface of the first strike plating layer. Each of the first strike plating layer and the second strike plating layer may have a thickness in a range of 20 nm to 100 nm. The first strike plating layer may be formed by plating at least one selected from gold, silver, and palladium using a strike plating method, the second strike plating layer may be formed by plating at least one selected from gold, silver, and palladium using the strike plating method, and the second strike plating layer may be made of a different material from the first strike plating layer. In some representative embodiments, the first strike plating layer may have a thickness in a range of 20 nm to 100 nm, and the method may comprise forming a self assembly monolayer (SAM) coated on one or more portions, or the entire surface of the first strike plating layer.

As described above, because a lead frame for a semiconductor device in accordance with a representative embodiment of the present invention may include a base layer made of copper and a strike plating layer or a self assembly monolayer (SAM), oxidation of the base layer can be prevented while simplifying the manufacturing process, reducing the manufacturing cost, and reducing a failure rate.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:
1. A lead frame for a semiconductor device, the lead frame comprising:
a die pad;
a plurality of leads positioned adjacent to each other around the die pad;
a base layer made of copper; and a first strike plating layer formed directly on one or more portions of the surface of the base layer, wherein the first strike plating layer has a thickness in a range of 20 nm to 100 nm.

2. The lead frame of claim 1, wherein the first strike plating layer is formed by plating one or more of gold, silver, and palladium using a strike plating method.

3. The lead frame of claim 1, further comprising a second strike plating layer formed on one or more portions of the surface of the first strike plating layer.

4. The lead frame of claim 3, wherein the first strike plating layer and the second strike plating layer each has a thickness in a range of 20 nm to 100 nm.

5. The lead frame of claim 3, wherein the first strike plating layer is formed by plating one or more of gold, silver, and palladium using a strike plating method, and the second strike plating layer is formed by plating one or more of gold, silver, and palladium using the strike plating method.

6. The lead frame of claim 5, wherein the second strike plating layer is made of a different material from the first strike plating layer.

7. The lead frame of claim 1, further comprising a self assembly monolayer (SAM) coated on one or more portions of the surface of the first strike plating layer.

8. The lead frame of claim 7, wherein the first strike plating layer is formed by plating one or more of gold, silver and palladium using a strike plating method and the self assembly monolayer (SAM) is formed by depositing alkanethiol using a spin coating method.

9. A method of producing a lead frame for a semiconductor device, the method comprising:
forming a lead frame comprising a die pad and a plurality of leads positioned adjacent to each other around the die pad from a base layer made of copper;
forming a first strike plating layer directly on one or more portions of the surface of the base layer; and
forming a second strike plating layer on one or more portions of the surface of the first strike plating layer.

10. The method of claim 9, wherein forming the first strike plating layer comprises plating one or more of gold, silver, and palladium using a strike plating method.

11. The method of claim 9, wherein each of the first strike plating layer and the second strike plating layer has a thickness in a range of 20 nm to 100 nm.

12. The method of claim 9, wherein the first strike plating layer is formed by plating one or more of gold, silver, and palladium using a strike plating method, the second strike plating layer is formed by plating one or more of gold, silver, and palladium using the strike plating method, and the second strike plating layer is made of a different material from the first strike plating layer.

13. The method of claim 9, wherein the first strike plating layer has a thickness in a range of 20 nm to 100 nm, and wherein the method further comprises forming a self assembly monolayer (SAM) coated on one or more portions of the surface of the first strike plating layer.

14. A lead frame for a semiconductor device, the lead frame comprising:
a die pad; and
a plurality of leads positioned adjacent to each other around the die pad;
wherein the lead frame comprises:
a base layer made of copper,
a first strike plating layer formed directly on one or more portions of the surface of the base layer, and
a second strike plating layer formed on one or more portions of the surface of the first strike plating layer.

15. A method of producing a lead frame for a semiconductor device, the method comprising:
forming a lead frame comprising a die pad and a plurality of leads positioned adjacent to each other around the die pad from a base layer made of copper;
forming a first strike plating layer directly on one or more portions of the surface of the base layer; and
wherein the first strike plating layer has a thickness in a range of 20 nm to 100 nm.

\* \* \* \* \*